(12) United States Patent
Mönch et al.

(10) Patent No.: US 10,573,790 B2
(45) Date of Patent: Feb. 25, 2020

(54) OPTOELECTRONIC ARRANGEMENT HAVING A RADIATION CONVERSION ELEMENT AND METHOD FOR PRODUCING A RADIATION CONVERSION ELEMENT

(71) Applicant: OSRAM OLED GmbH, Regensburg (DE)

(72) Inventors: Wolfgang Mönch, Pentling (DE); Britta Göötz, Regensburg (DE); Frank Singer, Regenstauf (DE); Martin Straßburg, Donaustauf (DE); Tilman Schimpke, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/543,881

(22) PCT Filed: Jan. 26, 2016

(86) PCT No.: PCT/EP2016/051553
§ 371 (c)(1),
(2) Date: Jul. 14, 2017

(87) PCT Pub. No.: WO2016/120262
PCT Pub. Date: Aug. 4, 2016

(65) Prior Publication Data
US 2017/0365749 A1    Dec. 21, 2017

(30) Foreign Application Priority Data
Jan. 28, 2015  (DE) .................. 10 2015 101 216

(51) Int. Cl.
*H01L 33/50*   (2010.01)
*H01L 33/60*   (2010.01)
(Continued)

(52) U.S. Cl.
CPC ........ *H01L 33/502* (2013.01); *G02F 1/13362* (2013.01); *H01L 33/46* (2013.01);
(Continued)

(58) Field of Classification Search
CPC ..................... H01L 51/5293; H01L 33/502
(Continued)

(56) References Cited

U.S. PATENT DOCUMENTS

| 2,237,567 A | 4/1941 | Land |
| 6,774,974 B1 | 8/2004 | Matsuyama |

(Continued)

FOREIGN PATENT DOCUMENTS

| DE | 102006035635 A1 | 2/2008 |
| EP | 2386617 A1 | 11/2011 |

(Continued)

OTHER PUBLICATIONS

Hadar et al., "Physical Processes in Nanomaterials and Nanostructures; Polarization Properties of Semiconductor Nanorod Heterostructures: From Single Particles to the Ensemble," The Journal of Physical Chemistry Letters, Jan. 19, 2013, 4 pages, American Chemical Society.

(Continued)

*Primary Examiner* — David Vu
*Assistant Examiner* — Brandon C Fox
(74) *Attorney, Agent, or Firm* — Slater Matsil, LLP

(57) ABSTRACT

An optoelectronic arrangement having a radiation conversion element and a method for producing a radiation conversion element are disclosed. In an embodiment, an optoelectronic arrangement includes a semiconductor chip having an active region configured to generate radiation, a radiation conversion element arranged downstream of the semiconductor chip in an emission direction and a reflective polarization element arranged downstream of the radiation (Continued)

conversion element in the emission direction. The radiation conversion element has a plurality of conversion elements, each of which has an axis of symmetry, the spatial orientation of the axes of symmetry has a preferred direction and a radiation emitted by the radiation conversion element has a preferred polarization. The reflective polarization element largely allows radiation with the preferred polarization to pass through and largely reflects radiation polarized perpendicularly to the preferred polarization.

14 Claims, 3 Drawing Sheets

(51) Int. Cl.
  *H01L 33/48* (2010.01)
  *G02F 1/1335* (2006.01)
  *H01L 33/46* (2010.01)
  *H01L 51/52* (2006.01)
  *H01L 33/56* (2010.01)
  *H01L 33/58* (2010.01)

(52) U.S. Cl.
  CPC ............ *H01L 33/486* (2013.01); *H01L 33/56* (2013.01); *H01L 33/58* (2013.01); *H01L 33/60* (2013.01); *H01L 51/5293* (2013.01); *H01L 33/505* (2013.01); *H01L 2933/005* (2013.01); *H01L 2933/0041* (2013.01); *H01L 2933/0083* (2013.01); *H01L 2933/0091* (2013.01)

(58) Field of Classification Search
  USPC .......................................................... 257/98
  See application file for complete search history.

(56) References Cited

U.S. PATENT DOCUMENTS

| | | | |
|---|---|---|---|
| 7,236,223 B2 | 6/2007 | Matsuyama | |
| 8,045,163 B2 | 10/2011 | Grau | |
| 8,585,252 B2 | 11/2013 | Wanninger et al. | |
| 9,146,419 B1* | 9/2015 | Anandan | G02B 6/0035 |
| 2005/0057144 A1* | 3/2005 | Morita | H01L 33/56 |
| | | | 313/501 |
| 2007/0064407 A1* | 3/2007 | Huang | G02B 27/285 |
| | | | 362/19 |
| 2008/0042546 A1* | 2/2008 | Huang | B82Y 20/00 |
| | | | 313/495 |
| 2010/0277887 A1 | 11/2010 | Su et al. | |
| 2010/0302481 A1* | 12/2010 | Baum | B29D 11/00634 |
| | | | 349/96 |
| 2010/0315576 A1* | 12/2010 | Chung | G02F 1/133536 |
| | | | 349/62 |
| 2011/0216271 A1* | 9/2011 | Suzuki | G02F 1/13362 |
| | | | 349/71 |
| 2012/0256217 A1 | 10/2012 | Li et al. | |
| 2013/0032768 A1 | 2/2013 | Arbell et al. | |
| 2013/0107170 A1 | 5/2013 | Gee et al. | |
| 2013/0335677 A1 | 12/2013 | You | |
| 2014/0009902 A1 | 1/2014 | Banin et al. | |
| 2014/0016296 A1 | 1/2014 | Jeon et al. | |
| 2014/0204578 A1* | 7/2014 | Kim | F21V 11/16 |
| | | | 362/235 |
| 2014/0246689 A1 | 9/2014 | Luo et al. | |
| 2016/0003450 A1 | 1/2016 | Lee et al. | |
| 2016/0085102 A1 | 3/2016 | Ohmuro et al. | |
| 2016/0154275 A1* | 6/2016 | Saneto | G02B 5/26 |
| | | | 349/114 |
| 2016/0247984 A1* | 8/2016 | Liu | H01L 33/58 |

FOREIGN PATENT DOCUMENTS

| | | | | |
|---|---|---|---|---|
| EP | 2687902 A1 | 1/2014 | | |
| JP | 2004061565 A | 2/2004 | | |
| JP | 2013518932 A | 5/2013 | | |
| JP | 2014502403 A | 1/2014 | | |
| JP | 2014170938 A | 9/2014 | | |
| JP | 2014183192 A | 9/2014 | | |
| JP | 2016012047 A | * | 1/2016 | ............ G02B 5/30 |
| JP | 2016012047 A | * | 1/2016 | ......... G02F 1/13362 |
| KR | 1020130055058 A | 5/2013 | | |
| TW | 495636 B | 7/2002 | | |
| TW | 200814376 A | 3/2008 | | |
| TW | 201041190 A | 11/2010 | | |
| TW | 201348812 A | 12/2013 | | |
| WO | 2010095140 A2 | 8/2010 | | |
| WO | 2013180365 A1 | 12/2013 | | |
| WO | 2014196638 A1 | 12/2014 | | |

OTHER PUBLICATIONS

"Polarizing filter OPTICS," Encyclopedia Britannica, https://www.britannica.com/technology/polarizing-filter, accessed on Nov. 6, 2018.2011, 1 page, Encyclopedia Britannica, Inc.

Michelle, "Radiative Transitions between Electronic States," Nov. 14, 2002, 38 pages.

* cited by examiner

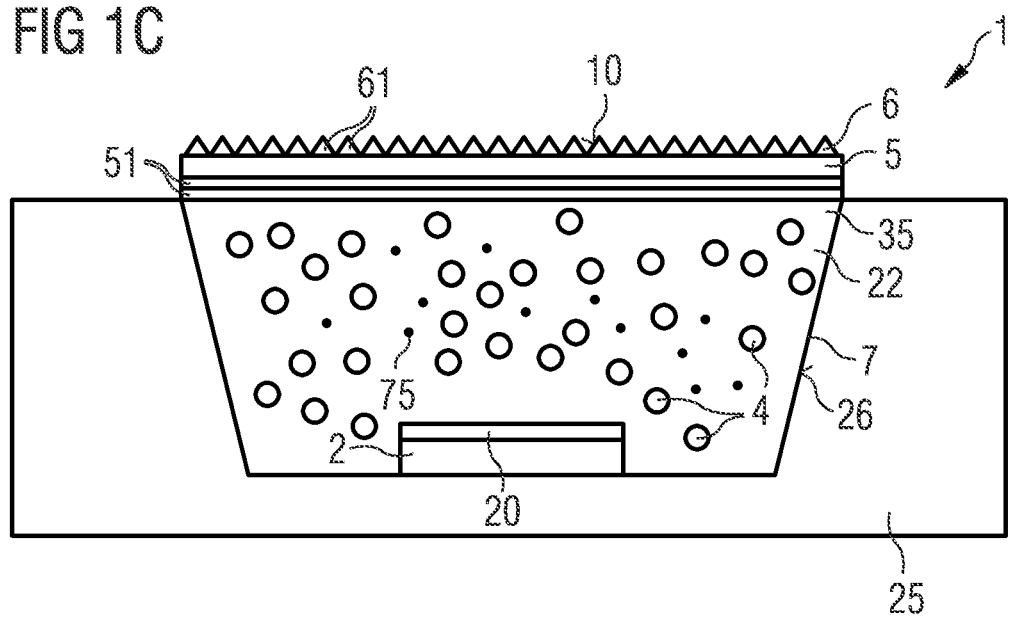
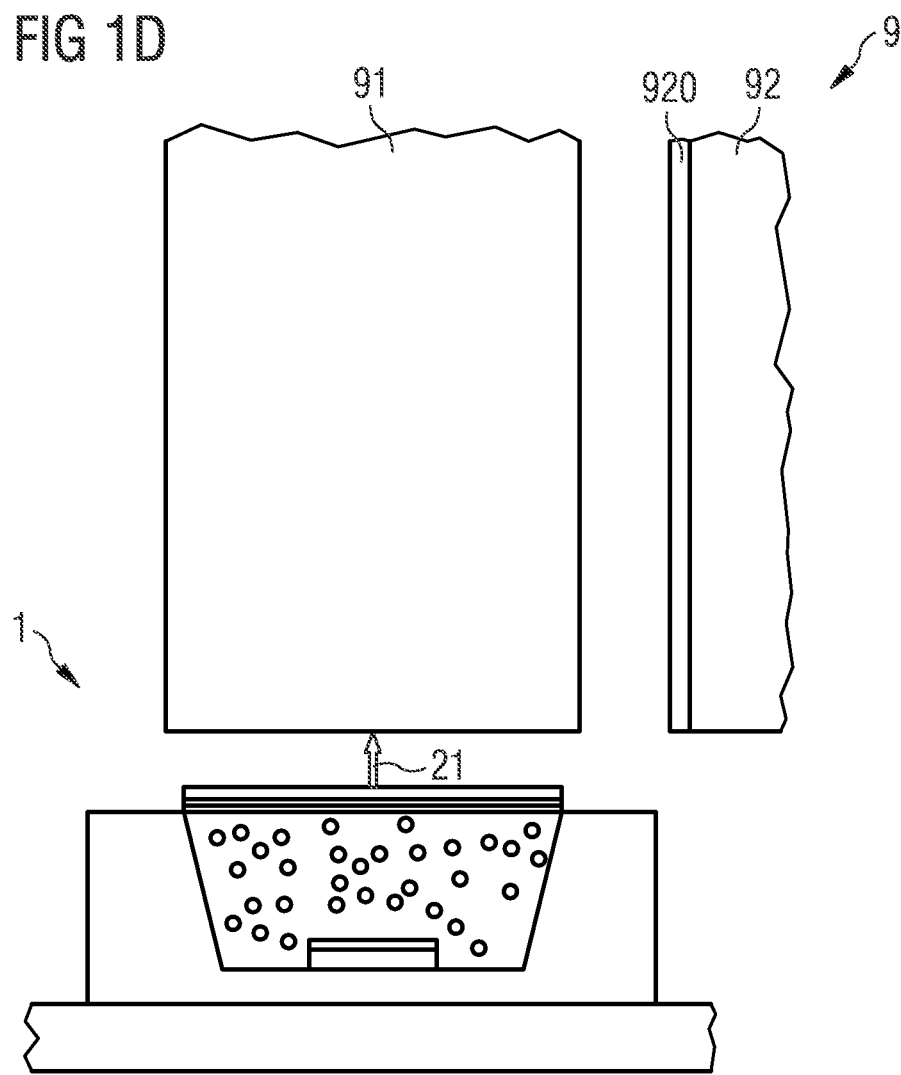

OPTOELECTRONIC ARRANGEMENT HAVING A RADIATION CONVERSION ELEMENT AND METHOD FOR PRODUCING A RADIATION CONVERSION ELEMENT

This patent application is a national phase filing under section 371 of PCT/EP2016/051553, filed Jan. 26, 2016, which claims the priority of German patent application 10 2015 101 216.2, filed Jan. 28, 2015, each of which is incorporated herein by reference in its entirety.

TECHNICAL FIELD

An optoelectronic arrangement having a radiation conversion element and a method for producing a radiation conversion element are provided.

BACKGROUND

Liquid crystal displays, LCDs for short, are often used to display in particular moving images, for example, in monitors or projectors. These can be back-lit with light-emitting diodes as radiation sources. However, a relatively large part of the radiation of the radiation sources typically gets lost due to the polarizers which are used in the LCDs for image generation. To compensate these losses, a correspondingly increased primary light flux of the radiation sources is provided, which results in an increased energy consumption.

SUMMARY OF THE INVENTION

Embodiments provide increased efficiency in the back-lighting of LCDs.

According to at least one embodiment of the optoelectronic arrangement, the arrangement comprises at least one semiconductor chip with an active region provided for the generation of radiation. In particular, the radiation is in the ultraviolet, visible, in particular blue or red, or in the close infrared spectral range. For example, the semiconductor chip is arranged in a housing or fixed unhoused to a connection carrier, such as a circuit board.

According to at least one embodiment of the optoelectronic arrangement, the arrangement comprises a radiation conversion element. In particular, the radiation conversion element is arranged downstream the semiconductor chip in the emission direction. In particular, the emission direction runs perpendicularly to a main extension plane of the active region. The radiation conversion element is provided for completely or at least partially converting primary radiation, which is generated by the at least one semiconductor chip, e.g., in the blue or ultraviolet spectral range, into secondary radiation. For example, the secondary radiation may be in the red, green, yellow and/or blue spectral range. In particular, the secondary radiation may contain radiation components in at least two different spectral ranges of the visible spectrum, e.g., in the red and in the green spectral range.

For example, the radiation conversion element is adjacent to the semiconductor chip. The radiation conversion element is an enclosure of the semiconductor chip, for example.

As an alternative, the radiation conversion element is a prefabricated element of the optoelectronic arrangement, for example. The prefabricated radiation conversion element is a self-supporting element, for example, such as a prefabricated film or a prefabricated plate.

According to at least one embodiment of the optoelectronic arrangement, the radiation conversion element comprises a multitude of conversion bodies. The term "conversion body" generally relates to bodies suitable for radiation conversion, e.g., phosphor particles or phosphor molecules. The conversion bodies may contain an inorganic and/or organic material. In particular, the conversion bodies may each comprise an axis of symmetry.

Organic materials such as a perylene, fluorescein, coumarin, rhodamine, stilbene, porphyrin, phthalocyanine, or pyrene, are suitable, for example.

Furthermore, inorganic semiconductor materials such as GaN, InN, AlN and mixed crystals thereof, such as InGaN or AlInGaN, $CuIn_2$, CdSe, CdS, InP, PbS, InAs, ZnSe, ZnSSE or ZnSSeTe, are suitable. In particular, quantum rods can be formed by means of inorganic semiconductor materials. In particular, volume bodies which experience a quantization of the energetic states due to their small size at least transversally to the longitudinal extension axis are considered to be quantum rods. In particular, the quantum rods are not spherically symmetric. For instance, the quantum rods are rotationally symmetrical with respect to their longitudinal extension axis.

According to at least one embodiment, the conversion bodies are elongate conversion bodies having a longitudinal extension axis. In particular, the longitudinal extension axis is the axis of symmetry. The elongate conversion bodies have a larger extent along the longitudinal extension axis than in directions transversal or perpendicular to this axis. The axis of symmetry extends along the direction along which the extent of the conversion bodies is the largest.

Furthermore, the radiation conversion element may comprise conversion bodies, which are different from one another with respect to the peak wavelength of the secondary radiation. For example, the first conversion body emits in the red spectral range, and the second conversion body emits in the green spectral range.

According to at least one embodiment of the optoelectronic arrangement, a spatial orientation of the conversion bodies has a preferred direction. For example, the spatial orientation of the conversion bodies relates to their axis of symmetry. Thus, the spatial orientation of the axes of symmetry has a preferred direction. Thus, the conversion bodies are not randomly distributed with respect to their orientation, for example, with respect to the orientation of their axes of symmetry. In particular, at least 50% of the conversion bodies, preferably at least 80% of the conversion bodies, are oriented in such a way that the axis of symmetry of the conversion bodies runs at an angle of no more than 20° with respect to the preferred direction. Ideally, all conversion bodies are oriented along the preferred direction. However, increased efficiency of the optoelectronic arrangement is achieved already when only part of the conversion bodies are oriented along the preferred direction.

The preferred direction extends parallel to a main extension plane of the active region.

According to at least one embodiment of the optoelectronic arrangement, a radiation emitted by the radiation conversion element having the plurality of conversion bodies has a preferred polarization. The preferred polarization in particular extends in a plane perpendicular to the preferred direction. The secondary radiation emitted by the radiation conversion element is thus at least partially polarized.

According to at least one embodiment of the optoelectronic arrangement, the optoelectronic arrangement comprises a reflective polarization element, which is arranged downstream the radiation conversion element in the emission direction. In particular, the radiation emitted by the semiconductor chip and the radiation conversion element has to pass the reflective polarization element before it is capable of exiting the optoelectronic arrangement. The reflective polarization element largely allows radiation with the preferred polarization to pass, i.e., at least 51% of this radiation. Preferably, the reflective polarization element allows at least 80% of the radiation with the preferred polarization to pass. The higher the transmission for this radiation component, the less can be the absorption losses on the whole. Furthermore, the reflective polarization element largely reflects radiation polarized perpendicular to the preferred polarization. Radiation with a polarization which does not correspond to the preferred polarization, does thus largely not get lost by the absorption on the polarization element, but is reflected and may once again impinge the reflective polarization element after at least one further reflection or scattering inside the optoelectronic arrangement and at least partially exit the optoelectronic arrangement.

Preferably, reflectivity of the reflective polarization element for this radiation component is at least 60%, particularly preferably at least 80%. For example, the reflective polarization element is formed as a pre-fabricated film. Such a film is offered by 3M Optical Systems under the name of DBEF (Dual Brightness Enhancement Film), for example. This film is provided to be arranged between light guides and liquid crystal displays, in order to increase brightness. However, it turned out that such a film can also be used for that the optoelectronic arrangement per se emits polarized or at least partially polarized radiation. This polarized or at least partially polarized radiation can be coupled into a light guide for back-lighting of a liquid crystal display or directly backlight the liquid crystal display.

In at least one embodiment of the optoelectronic arrangement, the optoelectronic arrangement comprises a semiconductor chip, which comprises an active region provided for the generation of radiation, with a radiation conversion element being arranged downstream the semiconductor chip in the emission direction. The radiation conversion element comprises a plurality of conversion bodies each having an axis of symmetry, wherein a spatial orientation of the axes of symmetry has a preferred direction. Radiation emitted by the radiation conversion element has a preferred polarization. The optoelectronic arrangement comprises a reflective polarization element, which is arranged downstream the radiation conversion element in the emission direction, wherein the reflective polarization element largely allows radiation with the preferred polarization to pass, and largely reflects radiation which is polarized perpendicular to the preferred polarization.

Thus, the optoelectronic arrangement does not emit non-polarized, but polarized or at least partially polarized radiation. In this context, partially-polarized means that a polarization direction predominates compared to a further polarization direction running perpendicularly thereto, for example, by at least 10%, preferably by at least 50%. The radiation component getting lost at a polarization filter on an input polarization filter of a downstream liquid crystal display due to its polarization can be reduced in this way. Thus, in contrast to an optoelectronic arrangement, which emits non-polarized radiation, it is not half of the emitted radiation that gets lost on these input polarization filters. The radiation component that can be used for back-lighting of a liquid crystal display is thus increased along with the same power consumption of the optoelectronic arrangement. Just as well, the same brightness of the back-lighting can be achieved with a reduced power consumption of the optoelectronic arrangement. In other words, the radiation polarization required for the functioning of the liquid crystal display is achieved not only by a polarization filter on the radiation input side, which in non-polarized radiation inevitably leads to a loss of half the radiation. Rather, radiation is generated in the optoelectronic arrangement in such a way that the radiation exiting this arrangement largely already has the suitable polarization, for example, 55% or more, or 65% or more thereof. In particular, in the radiation conversion element, radiation is generated in such a way that the suitable polarization predominates. Thus, increased efficiency compared to an arrangement having a convention radiation conversion element is achieved by the very radiation conversion element having the oriented conversion bodies. A further increase of efficiency can be achieved by the reflective polarization element, since radiation components that could not be used due to their polarization are at least predominantly not absorbed by the reflective polarization element, but are reflected and subsequently capable of exiting the optoelectronic arrangement.

According to at least one embodiment of the optoelectronic arrangement, the conversion bodies contain quantum rods and in particular have a ratio of longitudinal extension to maximum transversal extension between 1.5:1 and 40:1, inclusive. Conversion bodies having such a ratio have proved to be particularly suitable for a radiation conversion element for the generation of at least partially-polarized radiation.

In contrast, in particular conversion bodies formed by means of an organic material may also have a transversal extension which equals or at least substantially equals the extension along the axis of symmetry.

According to at least one embodiment of the optoelectronic arrangement, the semiconductor chip is at least in places surrounded by a reflector, in particular by a diffusely reflecting reflector. Radiation reflected at the reflective polarization element may have at least one radiation component of the preferred polarization after the diffuse reflection and exit the optoelectronic arrangement. For example, the reflector is formed by a wall of a housing body of the semiconductor chip. The reflector can also be formed by a layer that is directly adjacent to the semiconductor chip. Moreover, an anisotropic scattering can be achieved by means of polymeric fillers.

According to at least one embodiment of the optoelectronic arrangement, the radiation conversion element comprises a matrix material, in which the conversion bodies are embedded. The matrix material in particular contains a polymeric material.

According to at least one embodiment of the optoelectronic arrangement, the radiation conversion element is directly adjacent with the semiconductor chip. For example, the radiation conversion element forms an enclosure for the semiconductor chip. In particular, the radiation conversion element may also cover the side surfaces of the semiconductor chip in the form of an enclosure.

According to at least one embodiment of the optoelectronic arrangement, diffusors are embedded in the matrix material. The diffusers increase the probability that radiation, which does not have the preferred polarization, can exit the optoelectronic arrangement after being scattered at the diffusors. Preferably, the diffusors affect an anisotropic scattering.

According to at least one embodiment of the optoelectronic arrangement, the reflective polarization element has a plurality of layers having an anisotropic refractive index. A reflective polarization element can thus be produced to be compact in a simple and reliable manner.

According to at least one embodiment of the optoelectronic arrangement, the reflective polarization element has a higher reflectivity for the radiation emitted by the semiconductor chip than for the secondary radiation emitted by the radiation conversion element. It turned out that the efficiency of the optoelectronic arrangement can be increased since the secondary radiation is generated to be partially polarized by means of the conversion bodies and absorption losses inside the optoelectronic arrangement can be reduced further by a reduced reflectivity in the spectral range of the secondary radiation.

According to at least one embodiment of the optoelectronic arrangement, the reflective polarization element is adjacent to the radiation conversion element or is spaced from the radiation conversion element by no more than 200 μm. In particular, the radiation conversion element and the reflective polarization element can be fixed to one another in a mechanically stable manner. In particular, no light guide is present between the reflective polarization element and the radiation conversion element.

According to at least one embodiment of the optoelectronic arrangement, a main extension plane of the reflective polarization element and a main extension plane of the active region extend parallel to one another.

According to at least one embodiment of the optoelectronic arrangement, the optoelectronic arrangement is a surface-mounted semiconductor device. Thus, the optoelectronic arrangement is a semiconductor device that can be easily mounted, and which is characterized by a polarized or at least partially polarized radiation. As an alternative, the optoelectronic arrangement can be an arrangement of one semiconductor chip or multiple semiconductor chips on a connection carrier, e.g., a circuit board.

According to at least one embodiment of the optoelectronic arrangement, the optoelectronic arrangement is provided for back-lighting a liquid crystal display.

In this way, the back-lighting can be affected in a particular energy-efficient manner and allows for a long service life. The optoelectronic arrangement can in particular be provided for laterally coupling into a light guide or for direct back-lighting of the liquid crystal display.

In a method for producing a radiation conversion element, according to at least one embodiment, a basic material in liquid form is provided, which is provided with conversion bodies each having an axis of symmetry. The basic material is filled into a mold. The axes of symmetry of the conversion bodies are at least partially oriented along a preferred direction. The basic material is cured.

This achieves a radiation conversion element, in which conversion bodies are present in an oriented form in a matrix material. The described method allows for producing a radiation conversion element, which emits an at least partially-polarized secondary radiation when excited by a primary radiation, in a simple manner.

According to at least one embodiment of the method, the conversion bodies are oriented by means of an electrical field. The electrical field is applied in particular also during the curing process for at least as long as that the conversion bodies maintain their orientation along the preferred direction at least partially after turning-off the electric field.

According to at least one embodiment of the method, the mold is a cavity, in which at least one semiconductor chip is arranged. For example, the cavity is formed in a prefabricated housing for an in particular optoelectronic semiconductor component.

In contrast, the mold may also be provided to form self-supporting conversion elements, e.g., in the form of a plate or a film. In this case, the mold can be removed after the curing step.

Furthermore, a liquid-crystalline polymer can be used. The orientation process can be facilitated by means of such a polymer.

BRIEF DESCRIPTION OF THE DRAWINGS

Further embodiments and developments result from the following exemplary embodiments described in conjunction with the figures.

The figures show in:

FIG. 1D is an exemplary embodiment for a display apparatus having an optoelectronic arrangement.

Figure 1A:
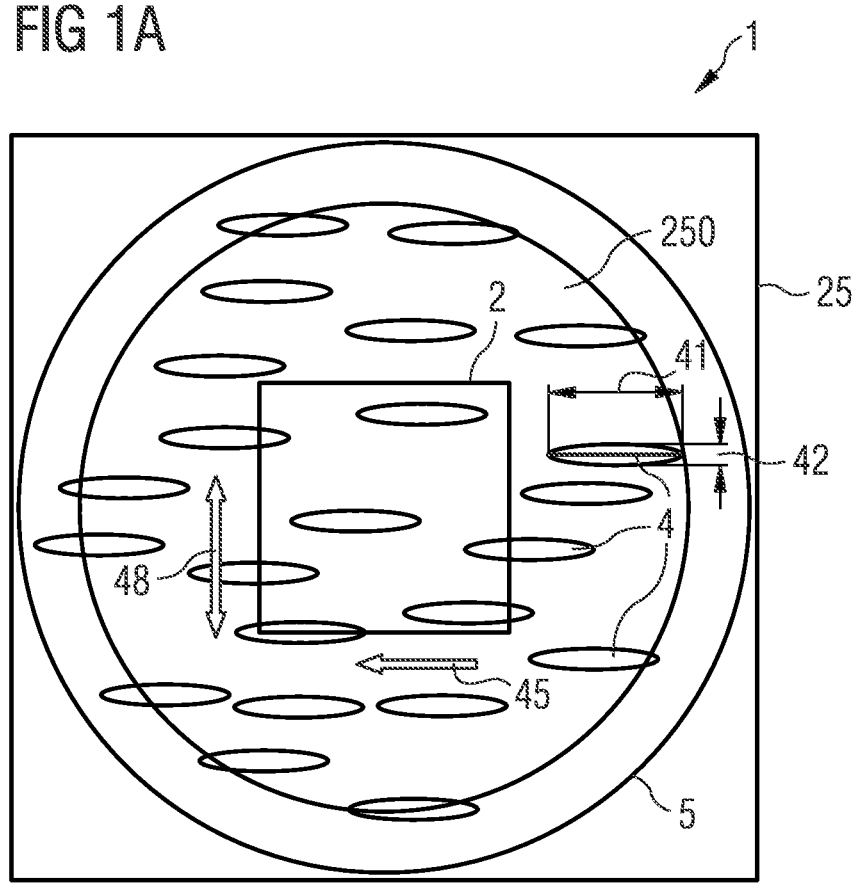
FIGS. 1A, 1B and C are exemplary embodiments for an optoelectronic arrangement in a schematic plan view (FIG. 1A) and in two associated sectional views (FIGS. 1B and 1C)

Like, similar or equivalent elements are indicated with the same reference numerals throughout the figures. The figures and dimensional relations of the elements shown in the figures are not to be understood as being to scale. Rather, individual elements and in particular layer thicknesses can be illustrated in an exaggerated size for a better illustration and/or understanding.

DETAILED DESCRIPTION OF ILLUSTRATIVE EMBODIMENTS

Figure 1B:
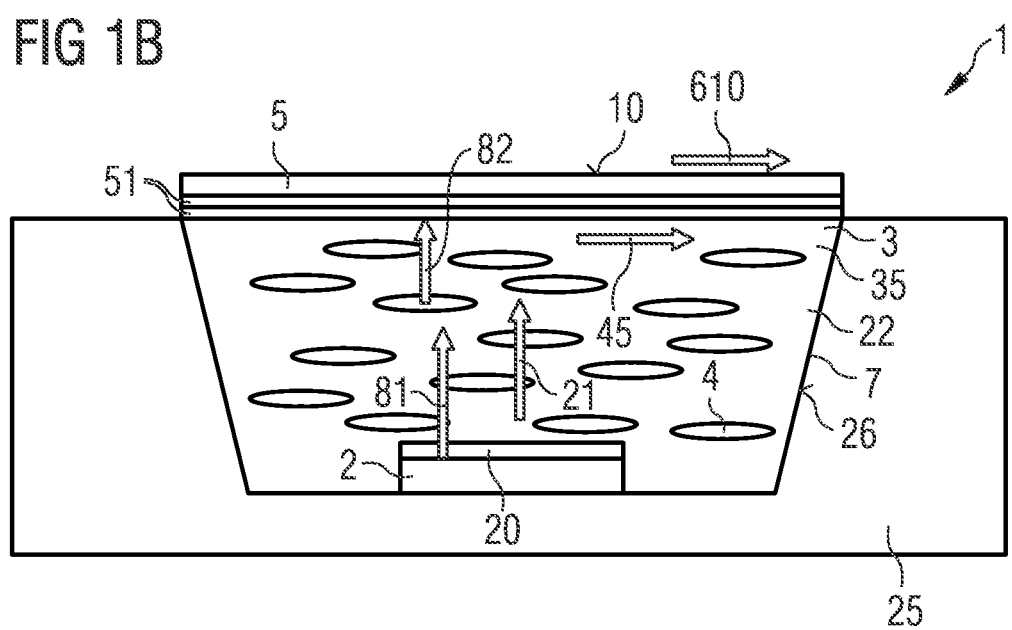

FIGS. 1A to 1C illustrate an exemplary embodiment for an optoelectronic arrangement 1 by means of a plan view and two sectional views, which are oriented perpendicularly to one another.

The optoelectronic arrangement 1 comprises a semiconductor chip 2 provided for the generation of radiation. For example, the semiconductor chip contains an active region on the basis of a nitride semiconductor compound material, such as $Al_xIn_yGa_{1-x-y}N$ with $0 \leq x \leq 1$, $0 \leq y \leq 1$ and $x+y \leq 1$, which is provided for the generation of radiation in the blue or ultraviolet spectral range. In particular, the radiation emitted by the semiconductor chip is unpolarised.

Furthermore, the optoelectronic arrangement 1 comprises a radiation conversion element 3, which is arranged downstream of the semiconductor chip 2 in an emission direction 21. Thus, the radiation conversion element 3 forms part of the optoelectronic arrangement. Thus, prior to the exit of the primary radiation, which is generated in operation of the optoelectronic arrangement, from a radiation output surface 10 of the optoelectronic arrangement, the radiation has to pass through the radiation conversion element 3.

The radiation conversion element 3 comprises a plurality of conversion bodies 4. The conversion bodies 4 each have an axis of symmetry 40. In the exemplary embodiment shown, the conversion bodies are elongated conversion bodies, e.g., inorganic quantum rods, in which a longitudinal extension axis forms the axis of symmetry. A longitudinal extension along the longitudinal extension axis is greater than a maximum transversal extension 42 running perpendicularly to the longitudinal extension direction.

The radiation conversion element 3 comprises a matrix material 35, with the conversion bodies 4 of the radiation conversion element 3 embedded therein. The matrix material in particular contains a polymeric material and/or an inorganic oxide. For example, PET, PE, PS, PMMA, an acrylate, an epoxy, a silicone, or an organic-inorganic polymer with at least one epoxy or a silicone, e.g., a silicon in which $Al_2O_3$ or $SiO_2$ is linked, may be considered as the matrix material.

When the conversion bodies 4 are optically excited by means of a primary radiation 81, the conversion bodies emit a secondary radiation 82.

The individual conversion bodies 4 are oriented in the radiation conversion element 3 in such a way that the axes of symmetry 40 of the conversion bodies 4 have a preferred direction 45. The preferred direction in particular runs perpendicular to the emission direction 21 and parallel to the active region 20. In the exemplary embodiment shown, all axes of symmetry 40 run parallel to the preferred direction. Ideally, the secondary radiation generated in the radiation conversion element 3 by the conversion bodies 4 is fully polarized, with a preferred polarization 48 of the radiation emitted by the radiation conversion element running in a plane perpendicularly to the preferred direction 45. However, individual conversion bodies 4 may also have an orientation of the axis of symmetry different from the preferred direction 45, so that the secondary radiation 82 is partially polarized.

For example, the elongate conversion bodies 4 have a ratio of longitudinal extension to the maximum transversal extension between 1.5:1 and 40:1, inclusive.

The conversion bodies 4 may be phosphor particles or phosphor molecules, for example. The conversion bodies may furthermore contain an organic and/or inorganic material. In particular, the inorganic and organic materials indicated in the general part of the description are suitable for the conversion bodies.

In contrast to the described exemplary embodiment, the conversion bodies do not necessarily have to be formed elongate. For example, organic molecules, the transversal extension of which equals or substantially equals the extension along the axis of symmetry can be used.

Furthermore, the optoelectronic arrangement 1 comprises a reflective polarization element 5. The reflective polarization element is arranged downstream of the radiation conversion element 3 in the emission direction 21. The reflective polarization element largely allows radiation with the preferred polarization to pass and largely reflects radiation which is polarized perpendicular to the preferred polarization. In the exemplary embodiment shown, the reflective polarization element 5 forms the radiation output surface 10 of the optoelectronic arrangement 1.

Preferably, the reflective polarization element 5 allows at least 80% of the radiation with the preferred polarization 48 to pass. Furthermore, the reflective polarization element largely reflects radiation components which are polarized perpendicular to the preferred polarization. Radiation of which the polarization does not correspond to the preferred polarization, does thus at least largely not get lost by absorption at the reflective polarization element, but is reflected and thus returns into the radiation conversion element 3. Preferably, the reflectivity for this radiation component is at least 60%, particularly preferably at least 80%.

For example, the reflective polarization element 5 is formed as a prefabricated film, which is fixed to the radiation conversion element 3. In a plan view of the radiation output surface, the reflective polymerization element 5 completely covers the radiation conversion element 3. In the exemplary embodiment shown, the reflective polarization element 5 is adjacent to the radiation conversion element 3. In contrast, these elements may also be spaced from one another, for example, at a distance of 200 µm at the most.

In the exemplary embodiment shown, the reflective polarization element 5 comprises a plurality of layers 51 with an anisotropic refractive index. As a result, a polarization-dependent transmission and at the same time a high reflectivity for not-transmitted radiation components can be achieved in a simple and reliable manner. The reflectivity and/or transmission can also be wavelength-selective and be higher or lower for the primary radiation than for the secondary radiation, for example.

Preferably, the reflective polarization element 5 has a higher reflectivity for the primary radiation, which is generated in the active region 20 in a non-polarized manner, than for the secondary radiation. Radiation components having the non-suitable polarization can thereby be reflected back due to a high reflectivity. In contrast, the secondary radiation is generated to be partially-polarized already, so that absorption losses inside the optoelectronic arrangement can be reduced due to a lower reflectivity.

The optoelectronic arrangement 1 further comprises a reflector 7, which is formed to be diffusely reflecting for the primary radiation and for the secondary radiation. Preferably, the reflector has a reflectivity of at least 80%. The higher the reflectivity, the lower can be the absorption losses inside the optoelectronic arrangement. In the exemplary embodiment shown, the reflector is formed by a wall 26 of a cavity 250 of a housing body 25. The semiconductor chip 2 is arranged in the cavity 250 and surrounded by the reflector in a lateral direction, i.e., parallel to a main extension plane of the active region 20. Radiation not having the suitable polarization to be capable of exiting the reflective polarization element can be reflected at this polarization element. The polarization state of the radiation changes randomly along with every in particular diffuse reflection inside the optoelectronic arrangement 1, for example, at the reflector 7, so that at least a part of the radiation is capable of exiting the optoelectronic arrangement 1 at a subsequent impinge on the reflective polarization element 5. Optionally, diffusors 75 may be embedded in the matrix material 35 for increasing the outcoupling probability.

The radiation, which is generated by the optoelectronic arrangement 1 and exiting through the radiation output surface 10 of the optoelectronic arrangement is polarized or at least partially polarized. Thus, the optoelectronic arrangement 1 per se provides polarized or at least partially polarized radiation, so that losses at the polarization filter, which is arranged on the radiation input side of the liquid crystal display, are reduced when backlighting of a liquid crystal display. Furthermore, the secondary radiation in the radiation conversion element 3 is generated to have a preferred polarization already due to the generation mechanism by means of oriented conversion bodies, and efficiency of the optoelectronic arrangement is increased.

In the exemplary embodiment shown, the optoelectronic arrangement shown is a surface mounted semiconductor device. The connection conductors, via which the semiconductor chip 2 can be electrically contacted externally from outside the housing body 25 from the side facing away from the radiation output surface 10, are not shown in the figures for the sakes of clarity.

In the exemplary embodiment shown, the radiation conversion element 3 is adjacent with the semiconductor chip 2 and forms an enclosure 22 for the semiconductor chip 2. However, the radiation conversion element may also be a prefabricated element, which is fixed to the semiconductor chip. Furthermore, the radiation conversion element 3 can also be spaced from the semiconductor chip 2 and in particular be provided in addition to an enclosure.

Furthermore, the radiation conversion element 3 may comprise conversion bodies 4, which generate secondary radiation components having different peak wavelengths.

For example, first conversion bodies generate radiation in the red spectral range, and second conversion bodies generate radiation in the green spectral range.

The optoelectronic arrangement 1 may of course also comprise more than one semiconductor chip 2 provided for the generation of radiation, wherein the semiconductor chips can each be arranged in a housing or multiple semiconductor chips can be arranged in a housing. Furthermore, as an alternative, multiple semiconductor chips can be arranged in a housing or be arranged in an un-housed fashion on a connection carrier, such as a circuit board, and be electrically contacted. The type of housing for the semiconductor chips 2 can be freely selected to a certain extent. For example, the housing body 25 may also be formed by a material, which is molded to the semiconductor chip 2 and in particular forms the reflector 7.

Furthermore, the optoelectronic arrangement 1 comprises an optical element 6. The optical element 6 is provided to deflect the radiation emitted by the radiation conversion element 3 and to deflect radiation exiting through the reflective polarization element in a manner so as to maintain polarization. To that end, the optical element comprises a plurality of longitudinal prisms in an exemplary manner, the longitudinal direction 610 of which is parallel to the preferred direction 45. In particular, the prisms are capable of collimating the radiation into a usable angular range. For example, the optical element 6 can be formed as a film, which is arranged on the reflective polarization element 5. The film may in particular be formed as a so-called brightness enhancement film (BEF). The optical element 6 and the reflective polarization element 5 can also be formed integrally in a film. Furthermore, the optical element may also be omitted.

One exemplary embodiment for a display apparatus 9 having the described arrangement 1 is schematically shown in FIG. 1D. The display apparatus comprises a light guide 91, into which the radiation emitted by the optoelectronic arrangement is coupled laterally. The optoelectronic arrangement 1 is arranged on a connection carrier 95, e.g., a circuit board. The radiation generated in the semiconductor chip 2 and the radiation emitted in the emission direction 21 pass the reflective polarization element 5 before being coupled into the light guide. Thus, the radiation coupled into the light guide is polarized or at least partially polarized. Expediently, the light guide is formed to maintain polarization. The radiation exiting from a main surface 910 of the light guide illuminates a liquid crystal display 92. Absorption losses on an input polarization filter 920 of the liquid crystal display are minimized due to the at least partially polarized emission of the optoelectronic arrangement 1. In particular, radiation components, which cannot be used for backlighting, e.g., due to unsuitable polarization, are already reduced when generating the radiation in the optoelectronic arrangement 1 in favor of an increase of the usable radiation.

In contrast to the exemplary embodiment shown, the optoelectronic arrangement 1 may also be provided for direct backlighting of the display apparatus.

Figure 2A:
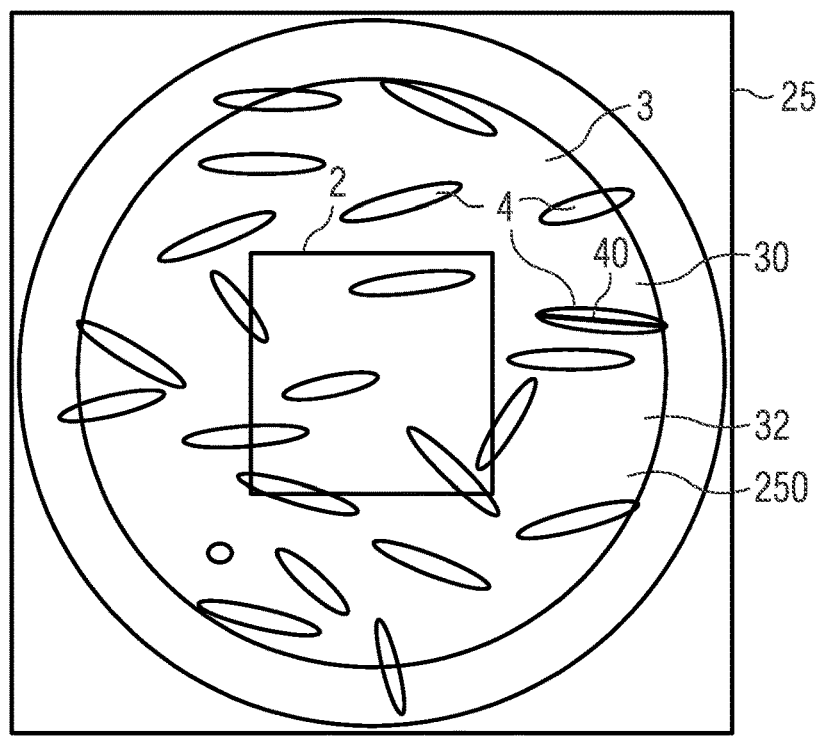
FIGS. 2A and 2B are exemplary embodiments for a method for producing a radiation conversion element by means of intermediate steps schematically shown in a plan view.
Figure 2B:
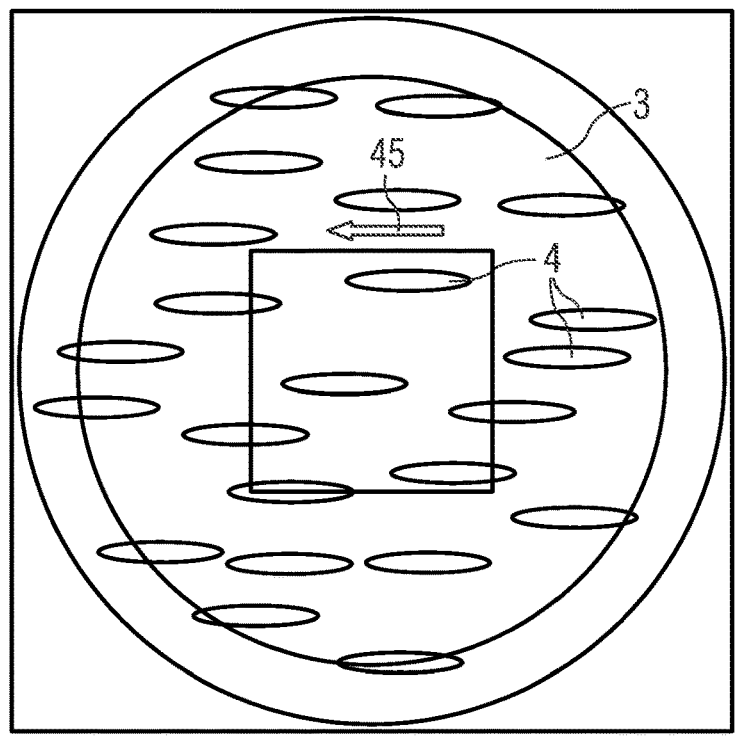

A method for producing a radiation conversion element is shown in a schematic plan view in FIGS. 2A and 2B by means of two intermediate steps. Description is given in an exemplary manner for a radiation conversion element as described in conjunction with FIG. 1A to 1C.

A basic material 30 in the liquid form, which is interspersed with elongate conversion bodies 4 each having an axis of symmetry, is provided for forming the radiation conversion element. The basic material is filled in a mold 32, e.g., by molding, injection molding, or transfer molding. In the exemplary embodiment shown, a cavity 250 of a housing body 25 serves as a mold. As shown in FIG. 2A, the axes of symmetry 40 are initially randomly oriented and do not have a preferred direction.

Subsequently, the axes of symmetry of the conversion bodies are oriented at least partially along a preferred direction 45, as shown in FIG. 2B. This may be achieved by applying an electrical field, for example. After that, the basic material 30 is cured, wherein the electrical field is appropriately applied at least for as long as the basic material is sufficiently solidified, so that the orientation of the conversion bodies 4 is maintained even after switching-off the electrical field.

Thus, a radiation conversion element 3 can be generated in a simple manner, which emits an at least partially polarized secondary radiation when excited by primary radiation.

In contrast to the described exemplary embodiment, self-supporting conversion elements, e.g., in the form of plates, can be formed with the method. To that end, the mold can be removed after the curing step.

The invention is not limited to the exemplary embodiments by the description of these embodiments. The invention rather comprises each new feature as well as each combination of features, which in particular includes any combination of features in the patent claims, even if this feature or this combination per se is not explicitly indicated in the patent claims or exemplary embodiments.

The invention claimed is:

1. An optoelectronic arrangement comprising:
   a semiconductor chip comprising an active region configured to generate radiation;
   a radiation conversion element arranged downstream of the semiconductor chip in an emission direction,
   wherein the radiation conversion element comprises a plurality of conversion bodies each having an axis of symmetry,
   wherein a spatial orientation of the axes of symmetry comprises a preferred direction, and
   wherein a radiation emitted by the conversion bodies comprises a preferred polarization; and
   a reflective polarization element arranged downstream of the radiation conversion element in the emission direction,
   wherein the reflective polarization element is configured to largely allow the radiation with the preferred polarization to pass, and to largely reflect radiation polarized perpendicular to the preferred polarization,
   wherein the radiation conversion element is at least in places directly adjacent to the semiconductor chip; and
   wherein the preferred direction of the conversion bodies and the preferred polarization are perpendicular to one another in a plane running perpendicularly to the emission direction.

2. The optoelectronic arrangement according to claim 1, wherein the conversion bodies contain quantum rods and have a maximum transversal extension perpendicularly to a longitudinal extension axis, and wherein a ratio of a longitudinal extension along the longitudinal extension axis to a maximum transversal extension is between 1.5:1 and 40:1, inclusive.

3. The optoelectronic arrangement according to claim 1, wherein the semiconductor chip is at least in places surrounded by a diffusely reflecting reflector.

4. The optoelectronic arrangement according to claim 1, wherein the radiation conversion element comprises a matrix material, in which the conversion bodies are embedded.

5. The optoelectronic arrangement according to claim 4, wherein diffusers are embedded in the matrix material.

6. The optoelectronic arrangement according to claim 1, wherein the reflective polarization element comprises a plurality of layers having an anisotropic refractive index.

7. The optoelectronic arrangement according to claim 1, wherein the reflective polarization element has a higher reflectivity for primary radiation emitted by the semiconductor chip than for secondary radiation emitted by the radiation conversion element.

8. The optoelectronic arrangement according to claim 1, wherein the reflective polarization element is adjacent to the radiation conversion element or spaced from the radiation conversion element by no more than 200 μm.

9. The optoelectronic arrangement according to claim 1, wherein a main extension plane of the reflective polarization element and a main extension plane of the active region are parallel to one another.

10. The optoelectronic arrangement according to claim 1, wherein the optoelectronic arrangement is a surface-mounted semiconductor device.

11. The optoelectronic arrangement according to claim 1, wherein the optoelectronic arrangement is provided for backlighting of a liquid crystal display.

12. The optoelectronic arrangement according to claim 1, wherein the reflective polarization element comprises a plurality of layers having an anisotropic refractive index, and wherein direct neighboring layers are directly adjacent to one another.

13. An optoelectronic arrangement comprising:
  a semiconductor chip comprising an active region configured to generate radiation;
  a radiation conversion element arranged downstream of the semiconductor chip in an emission direction,
  wherein the radiation conversion element comprises a plurality of conversion bodies each having an axis of symmetry,
  wherein a spatial orientation of the axes of symmetry comprises a preferred direction, and
  wherein a radiation emitted by the conversion bodies comprises a preferred polarization; and
  a reflective polarization element arranged downstream of the radiation conversion element in the emission direction, wherein the reflective polarization element largely allows radiation with the preferred polarization to pass, and largely reflects radiation polarized perpendicular to the preferred polarization,
  wherein the optoelectronic arrangement is a surface mounted semiconductor device; and
  wherein the preferred direction of the conversion bodies and the preferred polarization are perpendicular to one another in a plane running perpendicularly to the emission direction.

14. The optoelectronic arrangement according to claim 13, wherein the radiation conversion element is an enclosure of the semiconductor chip, and wherein the reflective polarization element is adjacent to the radiation conversion element or spaced from the radiation conversion element by no more than 200 μm.

\* \* \* \* \*